United States Patent
Liu et al.

(10) Patent No.: US 9,564,511 B2
(45) Date of Patent: *Feb. 7, 2017

(54) OXIDATION AND ETCHING POST METAL GATE CMP

(71) Applicant: Taiwan Semiconductor Manufacturing Company, Ltd., Hsin-Chu (TW)

(72) Inventors: Chi-Jen Liu, Hsin-Chu (TW); Li-Chieh Wu, Hsin-Chu (TW); Liang-Guang Chen, Hsin-Chu (TW); Shich-Chang Suen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/937,301

(22) Filed: Nov. 10, 2015

(65) Prior Publication Data

US 2016/0064518 A1    Mar. 3, 2016

Related U.S. Application Data

(63) Continuation of application No. 14/024,247, filed on Sep. 11, 2013, now Pat. No. 9,209,272.

(51) Int. Cl.
*H01L 21/00* (2006.01)
*H01L 29/66* (2006.01)
(Continued)

(52) U.S. Cl.
CPC ... *H01L 29/66545* (2013.01); *H01L 21/02074* (2013.01); *H01L 21/28123* (2013.01);
(Continued)

(58) Field of Classification Search
CPC .......... H01L 29/66545; H01L 29/4966; H01L 29/517; H01L 29/665; H01L 21/28088; H01L 29/6659; H01L 21/02074; H01L 21/28123; H01L 21/3212; H01L 21/76805; H01L 21/76829; H01L 21/46895
See application file for complete search history.

(56) References Cited

U.S. PATENT DOCUMENTS

| | | |
|---|---|---|
| 5,888,124 A | 3/1999 | Lin et al. |
| 5,960,270 A | 9/1999 | Misra et al. |

(Continued)

FOREIGN PATENT DOCUMENTS

| | | |
|---|---|---|
| KR | 20070017762 | 2/2007 |
| KR | 20080069699 A | 7/2008 |

(Continued)

*Primary Examiner* — Richard Booth
(74) *Attorney, Agent, or Firm* — Slater Matsil, LLP (57) ABSTRACT

A method includes forming a dummy gate of a transistor at a surface of a wafer, removing the dummy gate, and filling a metallic material into a trench left by the removed dummy gate. A Chemical Mechanical Polish (CMP) is then performed on the metallic material, wherein a remaining portion of the metallic material forms a metal gate of the transistor. After the CMP, a treatment is performed on an exposed top surface of the metal gate using an oxidation-and-etching agent comprising chlorine and oxygen.

20 Claims, 12 Drawing Sheets

(51) Int. Cl.
  *H01L 21/02* (2006.01)
  *H01L 21/321* (2006.01)
  *H01L 21/768* (2006.01)
  *H01L 21/28* (2006.01)
  *H01L 29/49* (2006.01)
  *H01L 29/51* (2006.01)
(52) U.S. Cl.
  CPC .... *H01L 21/3212* (2013.01); *H01L 21/76805* (2013.01); *H01L 21/76829* (2013.01); *H01L 21/76895* (2013.01); *H01L 29/665* (2013.01); *H01L 29/6659* (2013.01); *H01L 21/28088* (2013.01); *H01L 29/4966* (2013.01); *H01L 29/517* (2013.01)

(56) References Cited

U.S. PATENT DOCUMENTS

| | | |
|---|---|---|
| 6,890,846 B2 | 5/2005 | Noguchi |
| 9,209,272 B2 * | 12/2015 | Liu .................. H01L 29/66545 |
| 2007/0029280 A1 | 2/2007 | Lee et al. |
| 2007/0141798 A1 | 6/2007 | Bohr |
| 2011/0136313 A1 | 6/2011 | Lee et al. |
| 2012/0032268 A1 | 2/2012 | Hou et al. |
| 2013/0303420 A1 | 11/2013 | Cooper et al. |
| 2014/0106558 A1 | 4/2014 | Hsu et al. |

FOREIGN PATENT DOCUMENTS

| | | |
|---|---|---|
| KR | 20110064477 | 6/2011 |
| KR | 20120013876 | 2/2012 |
| WO | 2012051380 | 4/2012 |

* cited by examiner

OXIDATION AND ETCHING POST METAL GATE CMP

PRIORITY CLAIM AND CROSS-REFERENCE

This application is a continuation of U.S. patent application Ser. No. 14/024,247, entitled "Oxidation and Etching Post Metal Gate CMP," filed on Sep. 11, 2013, which application is incorporated herein by reference.

BACKGROUND

In the formation of integrated circuits, the gates of transistors are formed using either the gate-first approach or the gate-last approach. In the gate-first approach, polysilicon is often used to form the gate electrodes of the transistors. The formation of the polysilicon gate electrodes includes depositing a blanket polysilicon layer, and then etching the blanket polysilicon layer. The remaining portions of the polysilicon layer are the gate electrodes.

In the gate-last approach, metals are often used to form the gate electrodes of the transistors. The formation of the metal gates may include forming dummy gate electrodes, and then removing the dummy gate electrodes to form recesses. A suitable metallic material is then filled into the recesses, followed by a Chemical Mechanical Polish (CMP) to remove the excess portions of the metallic material. The remaining portions of the metallic material left in the recesses form replacement gates for the respective transistors.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A transistor having replacement gates and the method of forming the same are provided in accordance with various exemplary embodiments. The intermediate stages of forming the transistor are illustrated. The variations of the embodiments are discussed. Throughout the various views and illustrative embodiments, like reference numbers are used to designate like elements.

Figure 1:
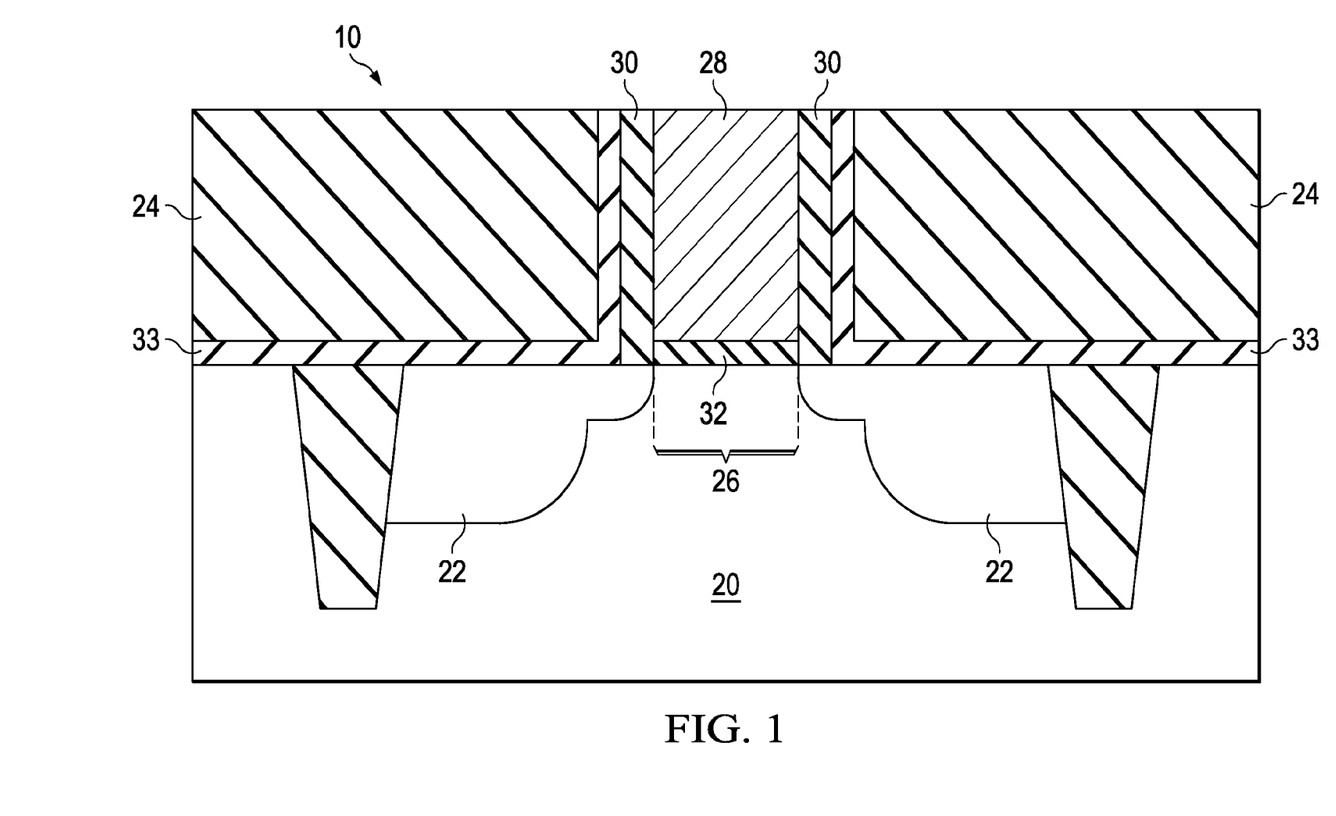
FIGS. 1 through 14 are cross-sectional views of intermediate stages in the manufacturing of a transistor in accordance with some exemplary embodiments.

FIGS. 1 through 14 are cross-sectional views of intermediate stages in the manufacturing of a MOS transistor and the respective contact plugs in accordance with some exemplary embodiments. Referring to FIG. 1, wafer 10 is provided. Wafer 10 includes substrate 20, which may be formed of a semiconductor material such as silicon, silicon germanium, silicon carbon, III-V compound semiconductor materials, or the like. Substrate 20 may be a bulk substrate or a Semiconductor-On-Insulator (SOI) substrate. Source and drain regions (also referred to as source/drain regions hereinafter) 22 are formed in substrate 20. Inter-Layer Dielectric (ILD, referred to as ILD0 hereinafter) 24 is formed over substrate 20. ILD0 24 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), or the like.

Dummy gate structure 26 is formed in ILD0 24. Dummy gate structure 26 includes dummy gate electrode 28, which may be formed of polysilicon, for example, although other materials may also be used. In some embodiments, dummy gate structure 26 further includes dummy gate dielectric 32 underlying dummy gate electrode 28. Gate spacers 30 may be formed on the sidewalls gate structure 26. In alternative embodiments, gate spacers 30 and/or dummy gate dielectric 32 are not formed. Furthermore, gate structure 26 may, or may not, include a hard mask layer (not shown) over dummy gate electrode 28, wherein the hard mask layer may be formed of silicon nitride, for example. The top surface of dummy gate structure 26 is level with the top surface of ILD0 24, which may be achieved by Chemical Mechanical Polish (CMP). Contact Etch Stop Layer (CESL) 33 is formed to cover source/drain regions 22, and may extend on the sidewalls of gate spacers 30. In some embodiments, CESL 33 comprises silicon nitride, silicon carbide, or other dielectric materials.

Figure 2:
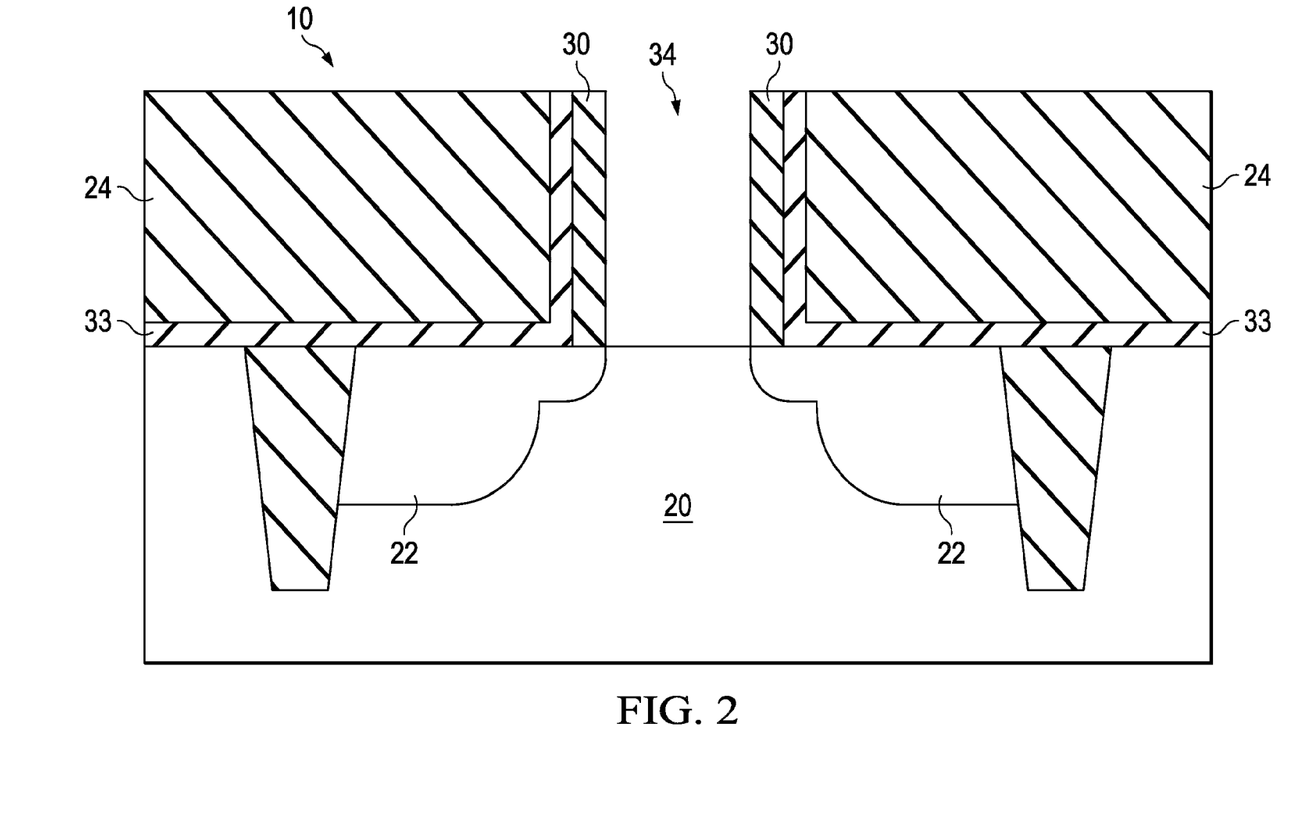

Dummy gate structure 26 is then removed through etching, and the resulting structure is shown in FIG. 2. Accordingly, trench 34 is formed in ILD0 24. The top surface of substrate 20 is exposed through trench 34 in some exemplary embodiments. Next, referring to FIG. 3, gate dielectric layer 36 is deposited as a blanket layer. Gate electrode layer 44, which is a conductive layer, is further deposited over gate dielectric layer 36. Each of gate dielectric layer 36 and gate electrode layer 44 comprises a portion overlying ILD0 24, and a portion in trench 34 (FIG. 2). In some embodiments, gate dielectric layer 36 and gate electrode layer 44 are conformal layers whose horizontal portions have substantially the same thicknesses as the respective vertical portions.

Figure 3:
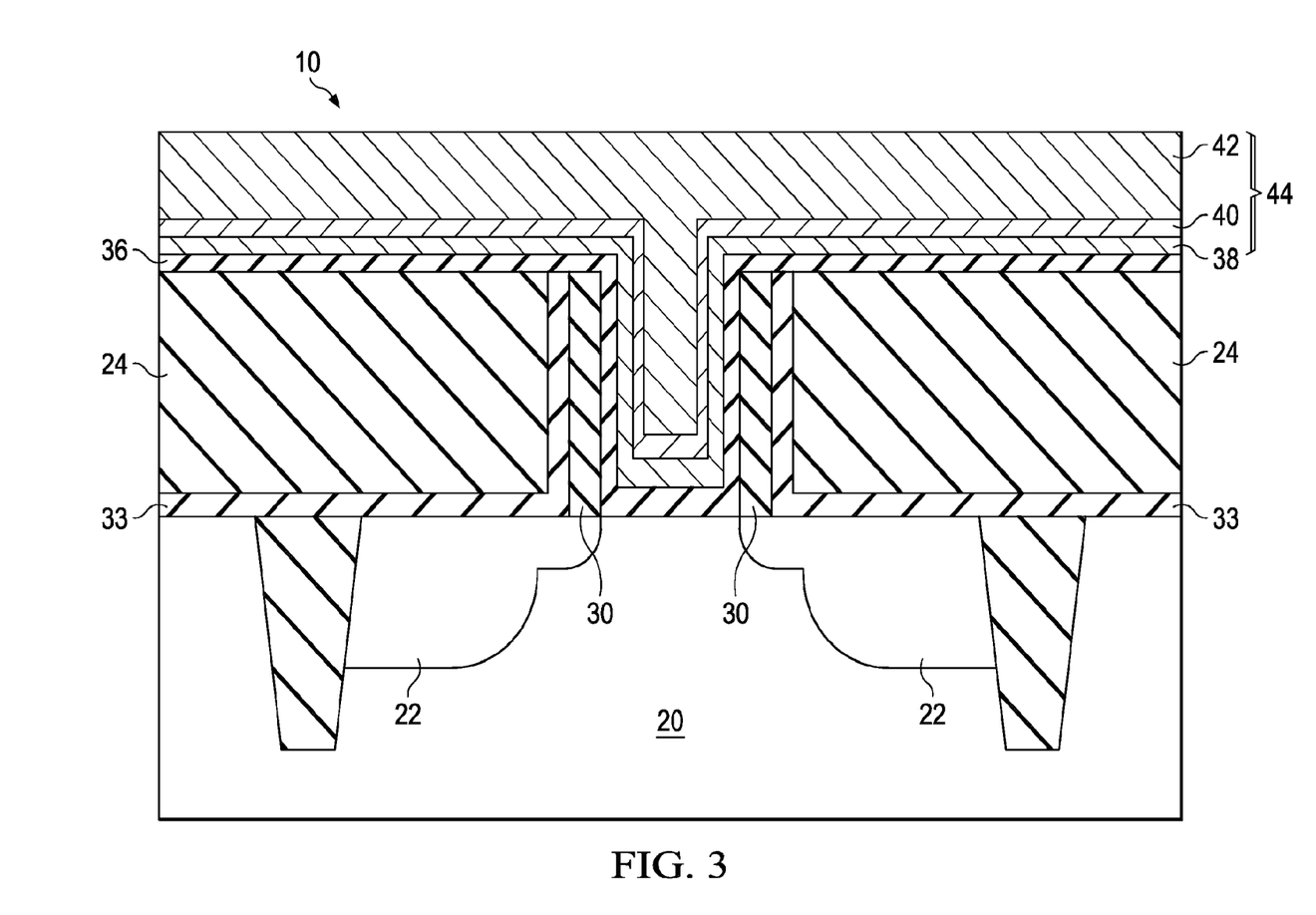

Gate dielectric layer 36 may be a single layer or a composite layer that includes a plurality of layers. For example, gate dielectric layer 36 may include an oxide layer and a high-k dielectric layer over the oxide layer. The oxide layer may be a silicon oxide layer formed through deposition. The high-k dielectric layer may have a k value greater than 7, or even greater than 20. Exemplary high-k dielectric materials include hafnium oxide, zirconium oxide, or the like.

In some embodiments, gate electrode layer 44 is formed to fill the entire remaining trench 34 (FIG. 2). Gate electrode layer 44 may have a single-layer structure formed of a homogeneous conductive material, or have a composite structure including a plurality of layers. FIG. 3 illustrates that gate electrode layer 44 includes conductive layers 38, 40, and 42 as an example. In some exemplary embodiments, conductive layer 38 comprises TiN. Conductive layer 40 may comprise TaSiN, WN, TiAl, TiAlN, TaC, and/or the like. Conductive layer 42 may be an aluminum-containing layer. The formation of gate electrode layer 44 may include Physical Vapor Deposition (PVD), Metal-Organic Chemical Vapor Deposition (MOCVD), and/or other applicable methods, depending on the materials of layers 38, 40, and 42.

Figure 4:
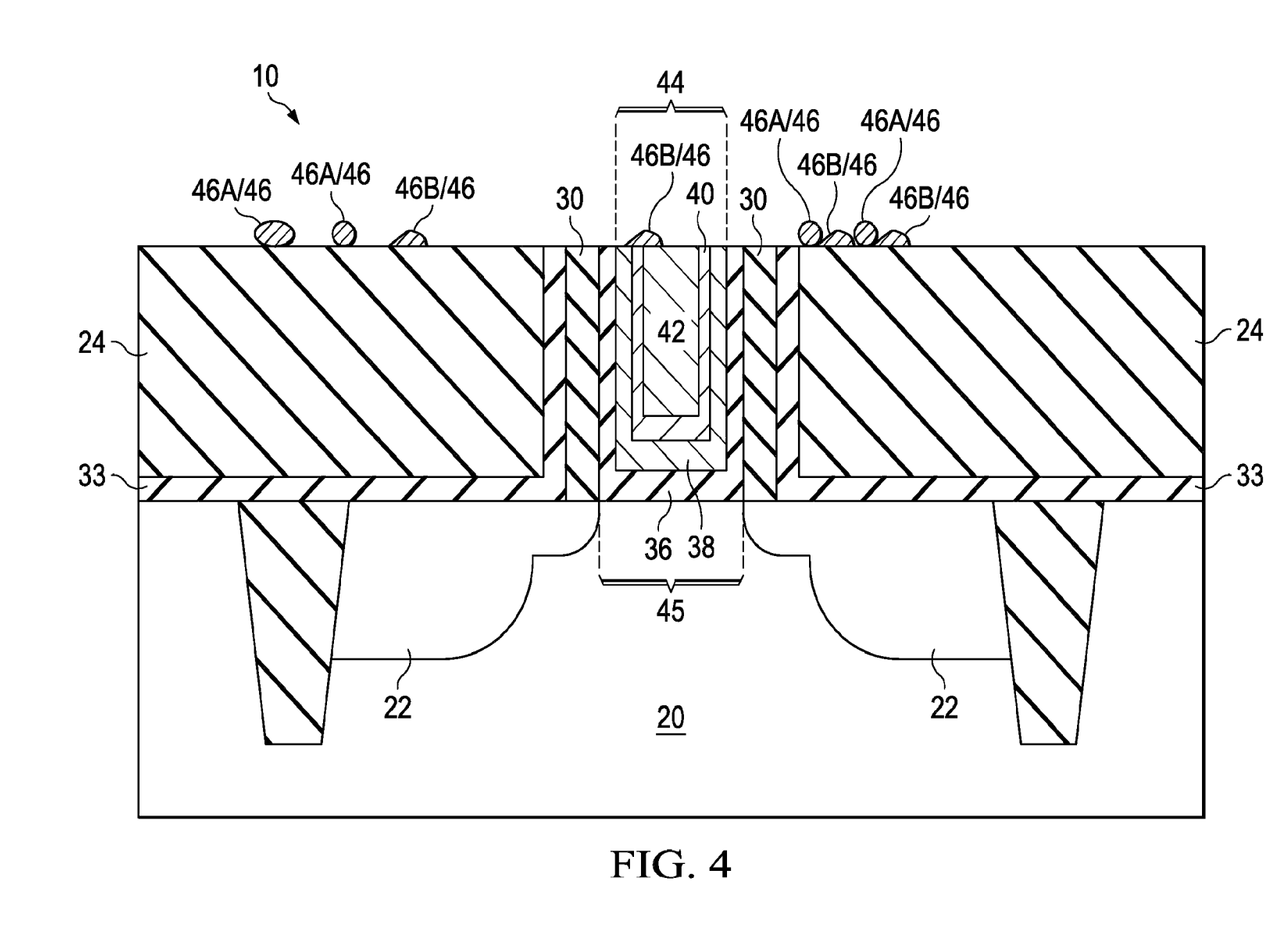

Referring to FIG. 4, a planarization such as a Chemical Mechanical Polish (CMP) is performed to remove excess portions of gate dielectric layer 36 and gate electrode layer 44, which excess portions are over ILD0 24. The remaining portions of gate dielectric layer 36 and gate electrode layer 44 are referred to as gate dielectric 36 and gate electrode 44 hereinafter, and are in combination referred to as replacement gate stack 45. In the illustrated embodiments, each of gate dielectric 36 and conductive layers 38 and 40 includes a bottom portion, and sidewall portions over and connected to the opposite ends of the bottom portion.

After the CMP process, undesirable substances 46 (including the schematically illustrated 46A and 46B) may be left over the top surface of the structure shown in FIG. 4. The undesirable substances may include metal particles 46A, which may be, for example, the particles of the polished layers 38, 40, and 42. The undesirable substances may also include some organic material 46B. For example, in the CMP, slurries are used. The composition of the slurries is adjusted to achieve a uniform polish rate for polishing the metallic material and ILD0 24. For example, aluminum-containing layer 42 suffers from corrosion during the CMP, and hence inhibitors such as the chemicals comprising functional group COOH may thus be added into the slurry to reduce the corrosion. The inhibitors may introduce some organic matter (illustrated as 46B), which is left on the top surface of the structure shown in FIG. 4. The organic material may comprise carbon. The undesirable substances 46A and 46B are removed in the steps shown in FIGS. 5 through 7.

Figure 5:
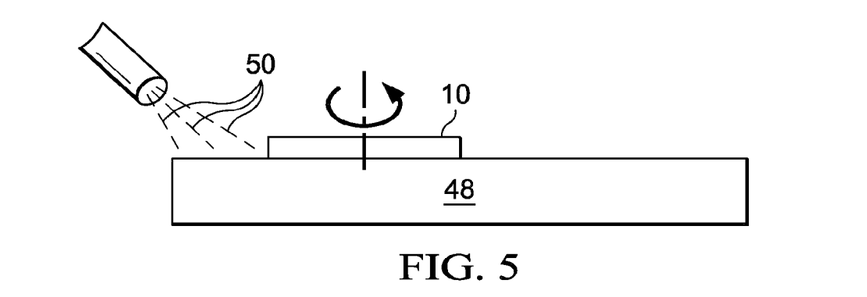

FIG. 5 illustrates the CMP step as discussed referring to FIGS. 3 and 4. Referring to FIG. 5, wafer 10 as in FIG. 3 is placed on polish pad 48, with the front surface (the top surfaces of wafer 10 in FIGS. 3 and 4) facing and contacting polish pad 48. Slurry 50 is dispensed onto polish pad 48. Wafer 10 is rotated and moved around on polish pad 48, and a force is applied to press wafer 10 against polish pad 48. Slurry 50 may include the inhibitor and some particles such as aluminum oxide for the polishing.

Figure 6:
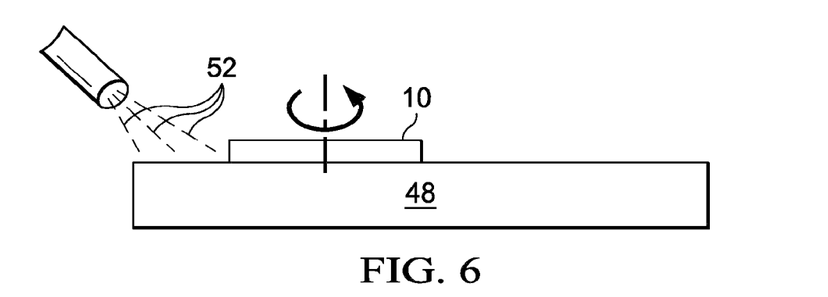

After the CMP, the structure as shown in FIG. 4 is obtained. Next, a treatment is performed to remove the undesirable substances 46A and 46B as in FIG. 4. The treatment may include one or more of a buffing treatment (FIG. 6), a megasonic treatment (FIG. 7), and a brush treatment (FIG. 8) in any combination. The treatment is also referred to as a cleaning. Referring to FIG. 6, a buffing treatment is performed. The buffing treatment may be performed using the same production tool that is used for the CMP. Furthermore, the buffing treatment may be performed on the same polish pad 48, although different production tool and/or a different polish pad may be used.

During the buffing treatment, slurry is no longer dispensed on polish pad 48. Instead, oxidation-and-etching solution 52 is dispensed on polish pad 48. Oxidation-and-etching solution 52 comprises an oxidation-and-etching agent capable of oxidizing metal particles 46A and organic material 46B, wherein the oxidation-and-etching agent is dissolved in water to form oxidation-and-etching solution 52. Oxidation-and-etching solution 52 is also capable of etching metal particles 46A and organic material 46B and the oxides generated from metal particles 46A and organic material 46B. During the buffing treatment, wafer 10 may also be rotated, and may be moved around on polish pad 48. The force applied during the buffing treatment, which force is applied for holding wafer 10 against polish pad 48, however, is reduced than the force used during the CMP. In some embodiments, no force or substantially no force is applied during the buffing treatment.

Figure 9:
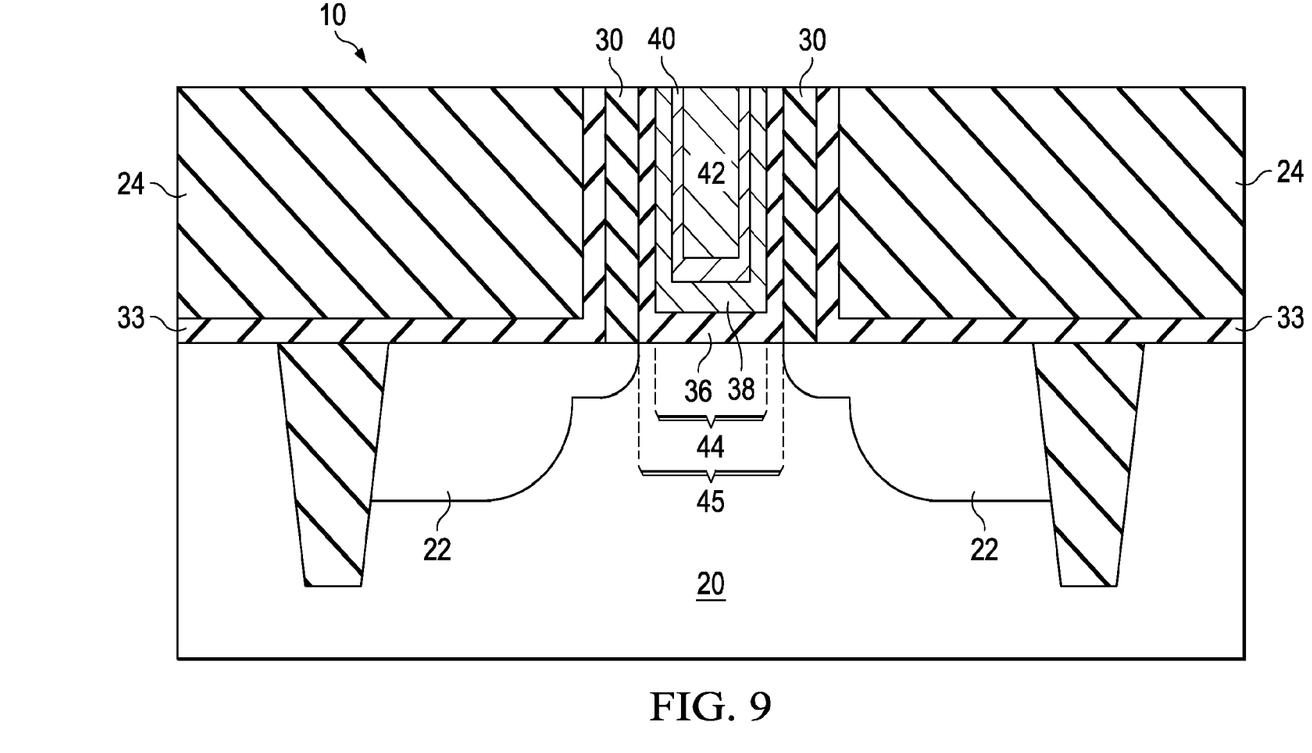

In some embodiments, oxidation-and-etching solution 52 comprises a bleach that is dissolved in water. In some exemplary embodiments, oxidation-and-etching agent 52 is a chlorine-and-oxygen-containing chemical, which may include HClO, NaClO, KClO, CaClO, etc. During the buffing treatment, oxidation-and-etching solution 52 oxidizes metal particles 46A and organic material 46B, and etches metal particles 46A and organic material 46B and the respective oxides. Accordingly, metal particles 46A and organic material 46B are removed, and the resulting structure is shown in FIG. 9. In some embodiments, the weight percentage of the oxidation-and-etching agent in oxidation-and-etching solution 52 is between about 0.005 percent and about 2 percent. The buffing treatment may be performed for a period of time in the range between about 10 seconds and about 2 minutes.

Figure 15:
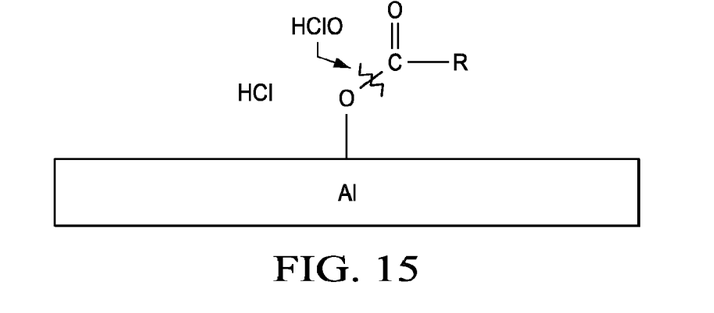
FIGS. 15 and 16 schematically illustrate the reactions occurring during the treatment of polished surfaces in accordance with some embodiments.
Figure 16:
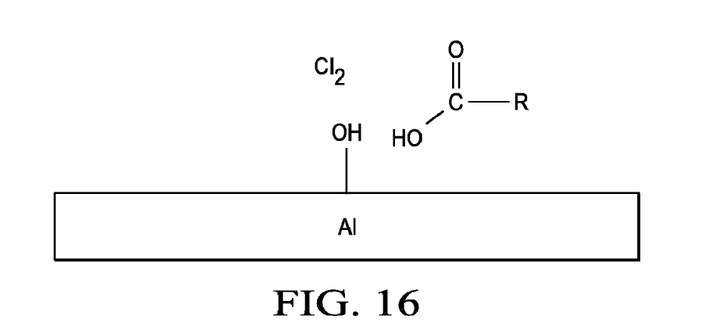

FIGS. 15 and 16 schematically illustrate the reactions occurring during the treatment, which reaction causes the removal of the organic matter. For example, as schematically illustrated in FIG. 15, the metal (such as aluminum (Al)) in gate electrode 44 forms bonds with the organic material 46B, which is shown as having function al group R, carbon, and oxygen. The oxidation-and-etching agent (such as HClO) reacts with the organic material 46B to break the bond (illustrated using an arrow) between oxygen and carbon, and hence causing the oxidation of the metal. In the meantime, the bonds between the metal and organic material 46B are broken. The following formulas illustrate the reaction.

[1]

[2]

wherein M may be Al as in FIG. 15. As shown in formula 1, hydrogen chloride (HCl) is generated, which functions to etch the metal and metal oxide. On the other hand, the bonds of the metal are terminated by OH (formula 2), and the bonds between the organic materials and the metal are broken by the HClO and HCl. The resulting bonds are shown in FIG. 16. Accordingly, oxidation-and-etching solution 52 performs the etching and the oxidation at the same time.

Figure 7:
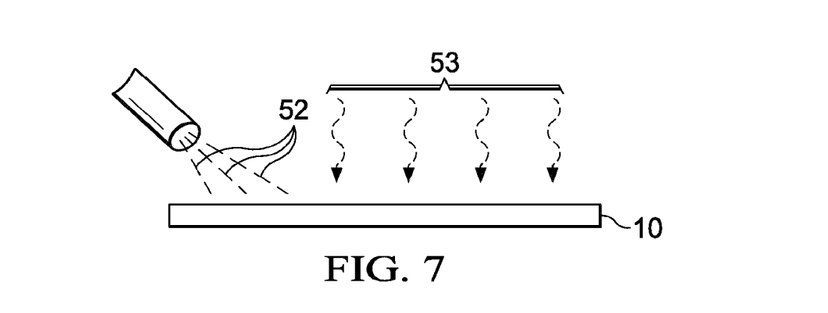

FIG. 7 illustrates a megasonic treatment (which is also a ultrasonic treatment), during which an ultrasonic sound 53 is applied on wafer 10. During the megasonic treatment, oxidation-and-etching solution 52 is sprayed on the top surface of wafer 10. Alternatively, wafer 10 is submerged in oxidation-and-etching solution 52, which is held in a container, and the megasonic treatment is performed when wafer 10 is submerged in oxidation-and-etching solution 52. The megasonic treatment may be performed for a duration in the range between about 0.5 minutes and about 3 minutes.

Figure 8:
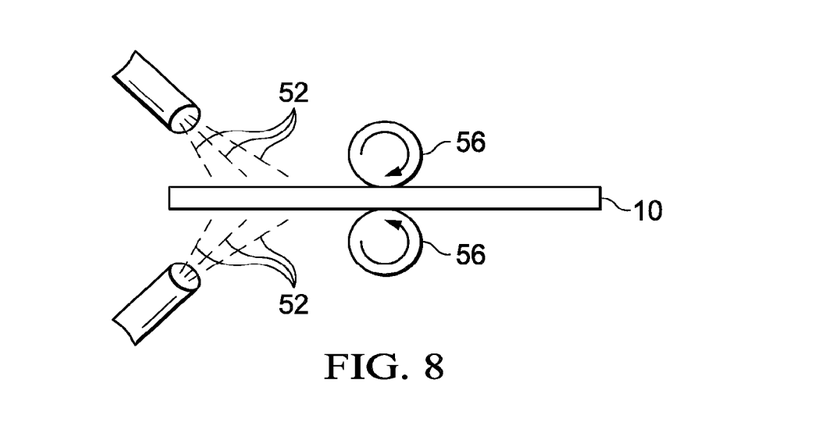

FIG. 8 illustrates a brush treatment (alternatively referred to as an ultrasonic treatment), during which wafer 10 is brushed by brushes 56. During the brush treatment, oxidation-and-etching solution 52 may be sprayed on the surfaces of wafer 10. The brush treatment may be performed for a duration in the range between about 30 seconds and about 3 minutes.

In accordance with some embodiments, all three of the buffing treatment, the megasonic treatment, and the brush treatment are performed using oxidation-and-etching solution 52. In alternative embodiments, one or two of the buffing treatment, the megasonic treatment, and the brush treatment (in any combination) is performed using oxidation-and-etching solution 52, while the remaining ones are performed using deionized water. In some embodiments, in the period of time after the CMP is performed and before the CESL 56 (FIG. 10) is formed, no treatment using chlorine ($Cl_2$) or $H_2O_2$ is performed since by using the oxidation-and-etching solution 52, both metal residue and organic residue have been removed, and hence the treatment using chlorine ($Cl_2$) or $H_2O_2$ is no longer needed.

Figure 10:
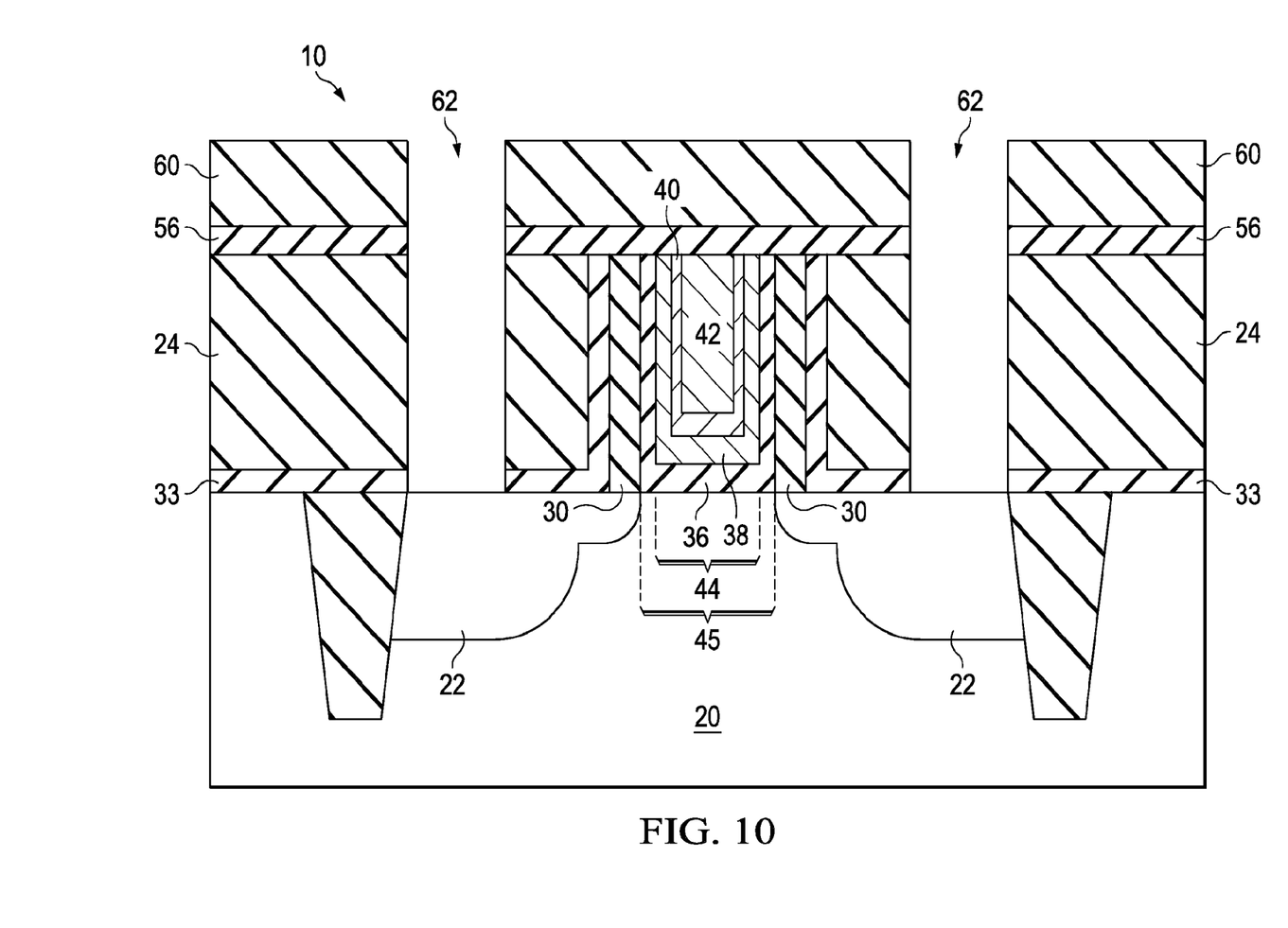
Figure 11:
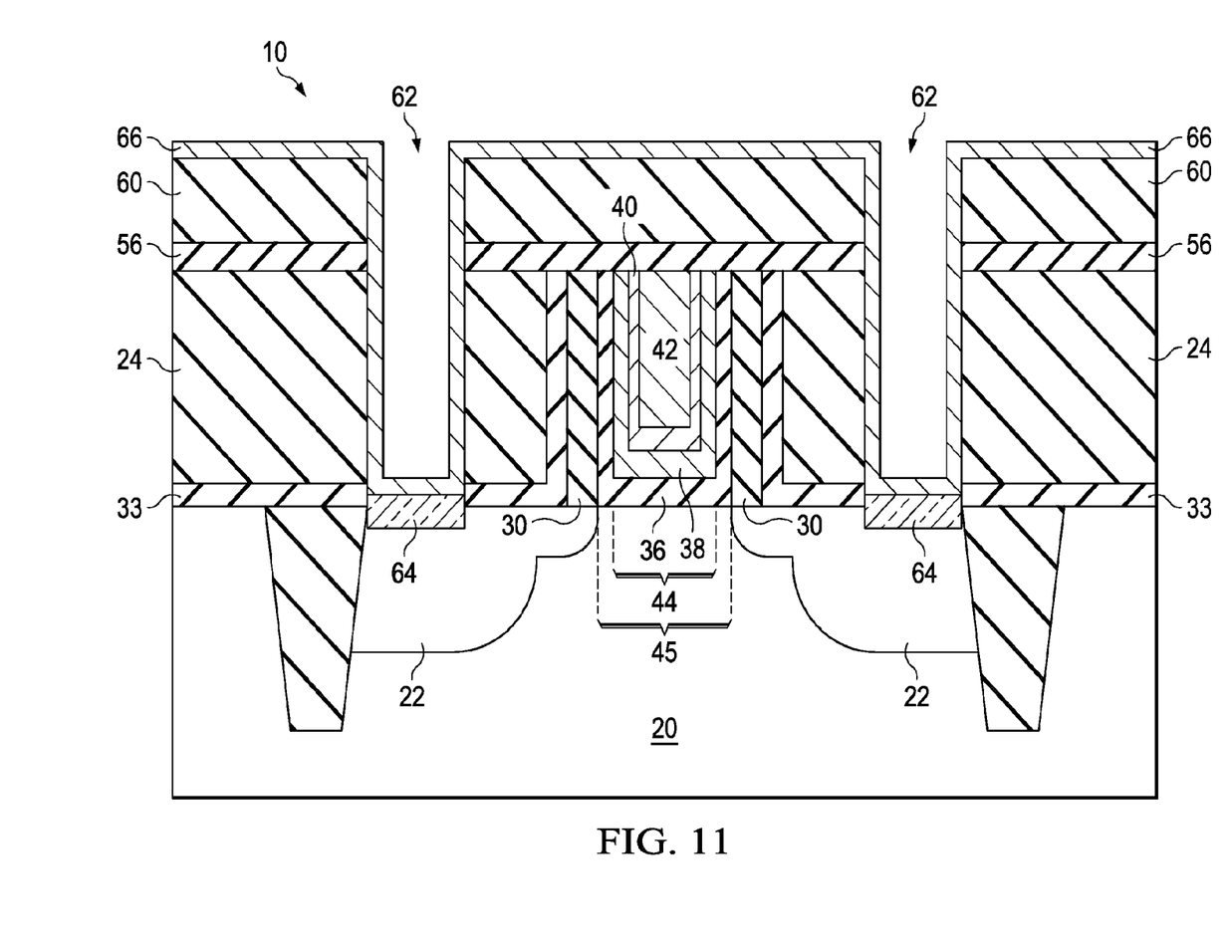
Figure 12:
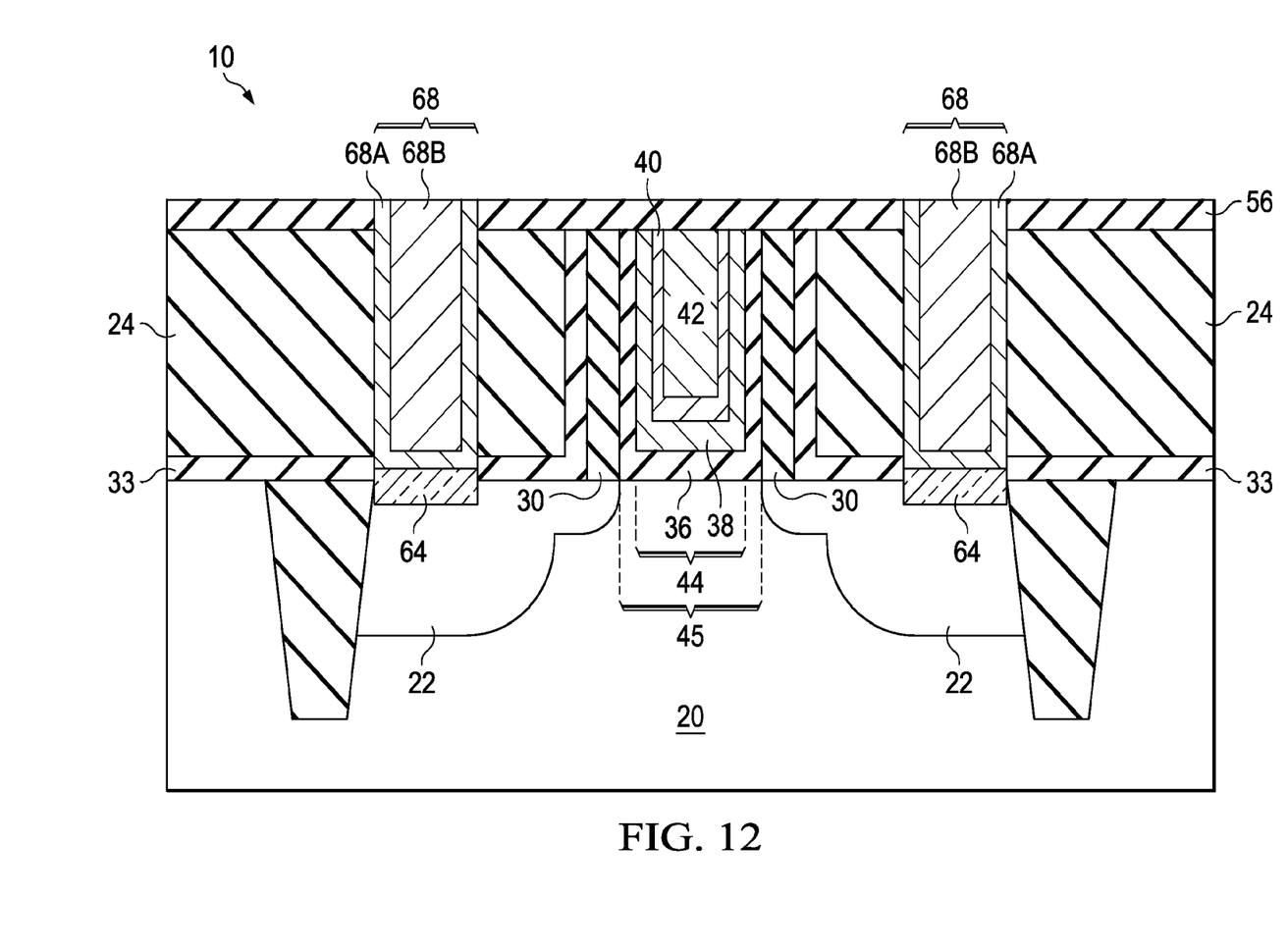

FIG. 9 illustrates wafer 10 after the treatment. FIGS. 10 through 12 illustrate the formation of source/drain silicide regions 64 and lower source/drain contact plugs 68 (FIG. 12), which are also referred to as M0_OD1 68 hereinafter, wherein the tem "OD" indicates that contact plugs 68 are connected to an active region. An exemplary formation process is briefly discussed as below. Referring to FIG. 10, CESL 56 and sacrificial ILD 60 are formed over the top surfaces of ILD0 24 and the replacement gate 44. It is appreciated that undesirable substances 46 (FIG. 4), if not removed, may cause poor adhesion between CESL 56 and metal gate 44 and ILD0 24. In the embodiments of the present disclosure, by removing the undesirable substances 46, the adhesion between CESL 56 and the underlying ILD0 24 and metal gate 44 is improved. In some embodiments, CESL 56 includes a dielectric material such as silicon carbon, silicon nitride, or the like. Sacrificial ILD 60 may include TEOS or other dielectric materials. Next, openings 62 are formed by etching sacrificial ILD 60, CESL 56, ILD0 24, and CESL 33, so that source/drain regions 22 are exposed. After the formation of openings 62, a pre-cleaning is performed to clean the exposed surfaces of source/drain regions 22.

Next, as shown in FIG. 11, a self-aligned silicidation is performed through openings 62 to form silicide regions 64 at the bottoms of openings 62. In the self-aligned silicidation, metal layer 66 is filled into openings 62. Metal layer 66 may comprise nickel, cobalt, or the like. An anneal may then be performed to form source/drain silicide regions 64 at the contact regions of metal layer 66. The reacted portions of metal layer 66 are then removed in an etching step, so that silicide regions 64 are exposed. It is appreciated that undesirable substances 46 (FIG. 4), if not removed when CESL 56 is formed, may be etched by the etchant used in the pre-clean step, which causes a void to be generated between CESL 56 and ILD0 24. The void may form a path that connects openings 62 to metal gate 44. The etchant for removing the remaining metal layer 66 may flow through the path to metal gate 44. The etchant thus causes metal gate 44 to be etched when the remaining metal layer 66 is removed. In the embodiments of the present disclosure, by removing the undesirable substances 46 (FIG. 4), the loss of metal gate 44 is reduced.

Next, a conductive material such as a metal, a metal alloy, a composite metallic layer comprising a plurality of layers, or the like, is filled into the remaining openings 62, followed by a CMP step to remove excess conductive material(s) and sacrificial layer 60. The resulting structure is shown in FIG. 12. During the CMP, CESL 56 is used as the CMP stop layer. The remaining portions of the conductive material(s) form contact plugs 68, which are referred to as M0_OD1s 68 hereinafter. In some embodiments, M0_OD1s 68 include adhesion/barrier layer 68A, and inner portions 68B over adhesion/barrier layer 68A. Adhesion/barrier layer 68A may comprise a material selected from titanium, titanium nitride, tantalum, tantalum nitride, combinations thereof, or multi-layers thereof. Inner portions 68B may be formed of tungsten, copper, aluminum, or a metal alloy, for example.

Figure 13:
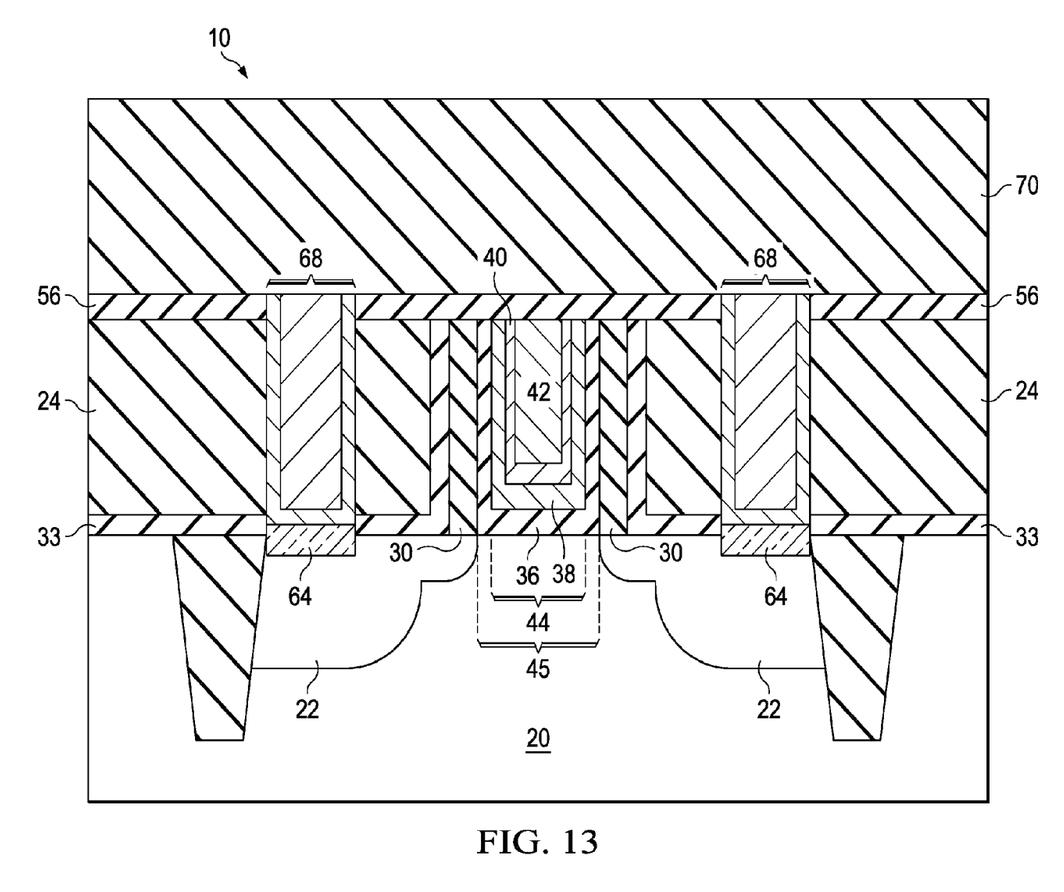
Figure 14:
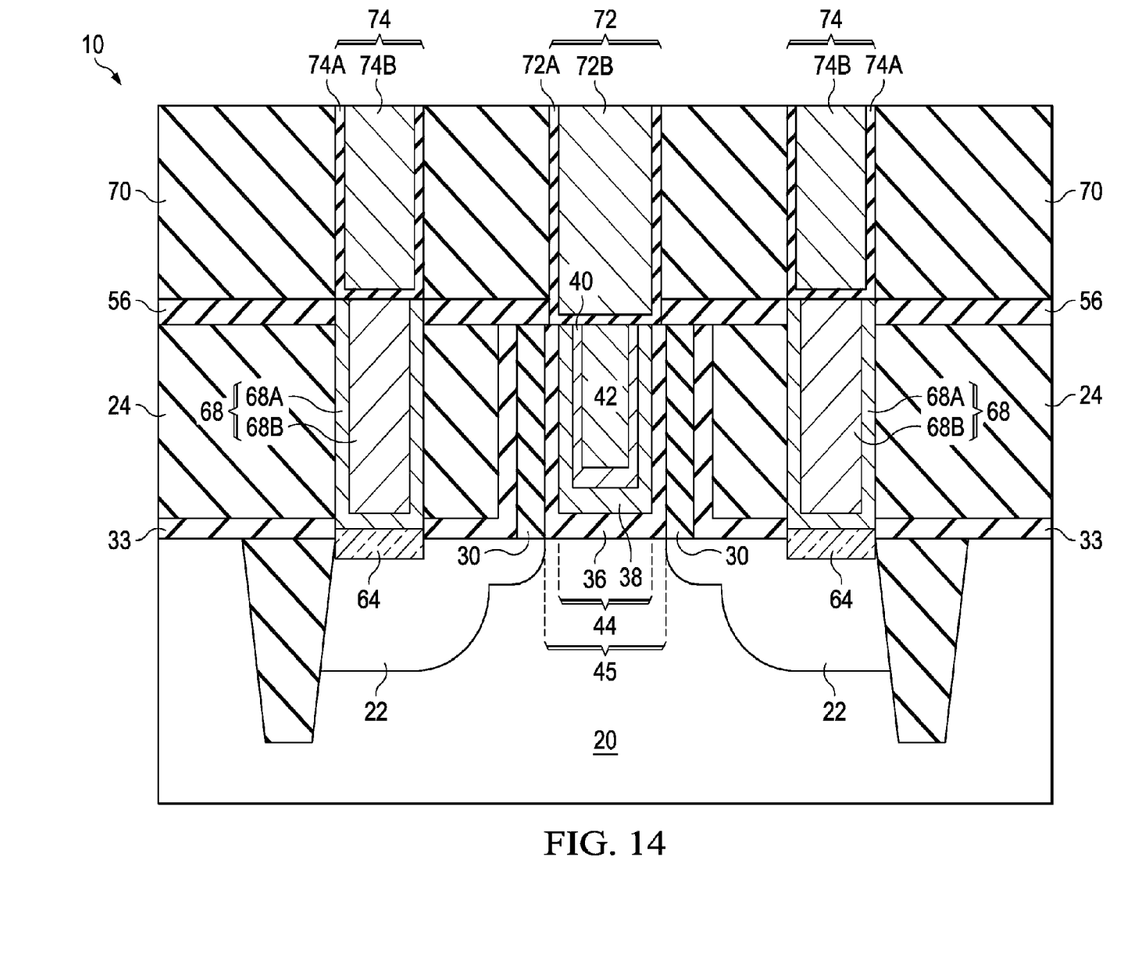

Referring to FIG. 13, another ILD, referred to as ILD1 70, is formed over etch stop layer 58. ILD1 70 may be formed of PSG, BSG, BPSG, TEOS oxide, or the like. Next, as shown in FIG. 14, gate contact plug 72 and source/drain contact plugs 74 are formed. Gate contact plug 72 and source/drain contact plugs 74 may be formed simultaneously, or formed in different process steps. Source/drain contact plugs 74 are also referred to as M0_OD2 or upper source/drain contact plugs hereinafter. Source/drain contact plugs 74 are aligned to, and are in contact with, the respective underlying M0_OD1s 68, which are lower source/drain contact plugs. Gate contact plug 72 is electrically coupled to gate electrode 44. Each of gate contact plug 72 and source/drain M0_OD2s 74 may include a barrier layer, which is referred to as 72A or 74A, and a copper-containing region, which is referred to as 72B or 74B. The formation process may include etching ILD1 70 to formed openings, and filling the openings with a barrier layer and a copper-containing layer. In some embodiments, barrier layer 72A and 74A include a layer selected from the group consisting of a Ti layer, a TiN layer, a Ta layer, a TaN layer, and multi-layers thereof. A CMP is then performed to remove the excess portions of the barrier layer and the copper-containing layer. The remaining portions of the barrier layer form barrier layers 72A and 74A, and the remaining portions of the copper-containing layer form copper-containing regions 72B and 74B.

The embodiments of the present disclosure have several advantageous features. By removing the undesirable substances that are left over the replacement gates, the metal gate loss and the delamination between the metal gate and the overlying CESL are reduced. Furthermore, since the oxidation-and-etching agent does not result in severe oxidation of the metal gates, the severe oxidation and the severe loss of metal gates that occurred in conventional post-CMP clean is substantially eliminated, and the performance of the resulting transistor is preserved.

In accordance with some embodiments, a method includes forming a dummy gate of a transistor at a surface of a wafer, removing the dummy gate, and filling a metallic material into a trench left by the removed dummy gate. A CMP is then performed on the metallic material, wherein a remaining portion of the metallic material forms a metal gate of the transistor. After the CMP, a treatment is performed on an exposed top surface of the metal gate using an oxidation-and-etching agent comprising chlorine and oxygen.

In accordance with other embodiments, a method includes forming a dummy gate of a transistor at a surface of a wafer, removing the dummy gate, and filling a metallic material into a trench left by the removed dummy gate. A CMP is performed on the metallic material, wherein a remaining portion of the metallic material forms a metal gate of the transistor. During the CMP, the wafer is polished on a polish pad, with a slurry dispensed on the polish pad. After the CMP, the slurry is stopped from being dispended on the wafer. After stopping dispensing the slurry, a treatment is performed on the wafer, wherein the treatment is selected from the group consisting essentially of a buffing treatment, a megasonic treatment, a brush treatment, and combinations thereof. During the treatment, an oxidation-and-etching agent comprising chlorine and oxygen is dispensed on the wafer.

In accordance with yet other embodiments, a method includes forming a dummy gate of a transistor at a surface of a wafer, removing the dummy gate, and filling a metallic material into a trench left by the removed dummy gate. A CMP is performed on the metallic material, wherein a remaining portion of the metallic material forms a metal gate of the transistor. After the CMP, metal particles and an organic residue on an exposed top surface of the metal gate are removed using an oxidation-and-etching solution comprising an oxidation-and-etching agent, wherein the oxidation-and-etching agent oxidizes and etches the metal particles and the organic residue simultaneously.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a dummy gate of a transistor at a surface of a wafer;
   removing the dummy gate;
   filling a metallic material into a trench left by the removed dummy gate to form a metal gate;
   performing a treatment on a top surface of the metal gate using an oxidation-and-etching agent comprising chlorine and oxygen; and
   forming a dielectric layer over the treated metal gate.

2. The method of claim 1, wherein the oxidation-and-etching agent comprises HClO or CaClO.

3. The method of claim 2, wherein the oxidation-and-etching agent comprises CaClO.

4. The method of claim 2, wherein the oxidation-and-etching agent comprises HClO.

5. The method of claim 1 further performing a planarization on the metallic material, wherein a remaining portion of the metallic material forms the metal gate, wherein the treatment comprises a buffing treatment, with an oxidation-and-etching solution comprising the oxidation-and-etching agent dispensed to the wafer during the treatment.

6. The method of claim 1, wherein the treatment comprises a megasonic treatment on the wafer, with the oxidation-and-etching agent dispensed on the wafer when an ultrasonic sound is applied on the wafer.

7. The method of claim 1, wherein the treatment comprises a brush treatment on the wafer, with the oxidation-and-etching agent dispensed on the wafer when the wafer is brushed.

8. The method of claim 1, wherein the dielectric layer comprises a Contact Etch Stop Layer (CESL), and the method further comprise:
   forming an opening extending into the CESL and an Inter-Layer Dielectric (ILD) underlying the CESL to expose a source/drain region of the transistor, wherein in the forming the opening in the ILD, the CESL is used as an etch stop layer.

9. The method of claim 8 further comprising:
   filling a metal layer into the opening;
   performing an anneal to silicide an exposed portion of the source/drain region;
   removing un-reacted portions of the metal layer; and
   filling a remaining portion of the opening to form a contact plug.

10. A method comprising:
    performing a Chemical Mechanical Polish (CMP) on a metal gate of a transistor, wherein during the CMP, a wafer comprising the metal gate is polished using a polish pad, with a slurry dispensed on the polish pad;
    after the CMP, stopping dispensing the slurry; and
    after stopping dispensing the slurry, performing a treatment on the wafer, wherein the treatment is selected from the group consisting essentially of a buffing treatment, a megasonic treatment, a brush treatment, and combinations thereof, and wherein during the treatment, an oxidation-and-etching agent comprising chlorine and oxygen is dispensed on the wafer.

11. The method of claim 10, wherein the oxidation-and-etching agent comprises HClO.

12. The method of claim 10, wherein the buffing treatment is performed with the wafer placed on the polish pad and rotated.

13. The method of claim 10, wherein during the megasonic treatment, the oxidation-and-etching agent is dispensed on the wafer when an ultrasonic sound is applied on the wafer.

14. The method of claim 10, wherein during the brush treatment, the oxidation-and-etching agent is dispensed on the wafer when the wafer is brushed.

15. The method of claim 10 further comprising:
    after the treatment, forming a Contact Etch Stop Layer (CESL) over and contacting the metal gate; and
    forming an opening extending into the CESL and an Inter-Layer Dielectric (ILD) underlying the CESL to expose a source/drain region of the transistor, wherein in the forming the opening in the ILD, the CESL is used as an etch stop layer.

16. The method of claim 10 further comprising:
    forming a dummy gate of the transistor at a surface of a wafer;
    removing the dummy gate; and
    filling a metallic material into a trench left by the removed dummy gate, wherein the CMP is performed to remove excess portions of the metallic material.

17. A method comprising:
    forming a dummy gate of a transistor above a surface of a wafer;
    removing the dummy gate;
    filling a metallic material into a trench left by the removed dummy gate;
    performing a Chemical Mechanical Polish (CMP) on the metallic material, wherein a remaining portion of the metallic material forms a metal gate of the transistor;
    removing metal particles and an organic residue on the metal gate using an oxidation-and-etching solution comprising an oxidation-and-etching agent, wherein the oxidation-and-etching agent oxidizes and etches the metal particles and the organic residue simultaneously; and
    after the removing the metal particles and the organic residue, forming a dielectric layer on the treated metal gate, wherein between the CMP and the forming the dielectric layer, no treatment using chlorine ($Cl_2$) or $H_2O_2$ is performed.

18. The method of claim 17, wherein the oxidation-and-etching agent comprises a bleach.

19. The method of claim 17, wherein the oxidation-and-etching agent comprises HClO.

20. The method of claim 17, wherein the dielectric layer is a Contact Etch Stop layer (CESL), and the method further comprises:
- forming an opening in the CESL and an Inter-Layer Dielectric (ILD) underlying the CESL to expose a source/drain region of the transistor;
- filling a metal layer into the opening;
- performing an anneal to silicide an exposed portion of the source/drain region;
- removing un-reacted portions of the metal layer; and
- filling an remaining portion of the opening to form a contact plug.

* * * * *